United States Patent
Strom et al.

(10) Patent No.: US 10,804,905 B2
(45) Date of Patent: Oct. 13, 2020

(54) USING A BURN-IN OPERATIONAL AMPLIFIER FOR A PHASED LOCKED LOOP REGULATOR

(71) Applicant: International Business Machines Corporation, Armonk, NY (US)

(72) Inventors: James Strom, Rochester, MN (US); Grant P. Kesselring, Rochester, MN (US); David M. Friend, Stewartville, MN (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 16/002,802

(22) Filed: Jun. 7, 2018

(65) Prior Publication Data
US 2019/0379383 A1    Dec. 12, 2019

(51) Int. Cl.
*H03L 7/08* (2006.01)
*H03L 7/093* (2006.01)
*H03F 3/45* (2006.01)

(52) U.S. Cl.
CPC ....... *H03L 7/0802* (2013.01); *H03F 3/45475* (2013.01); *H03L 7/093* (2013.01); *H03F 2203/45116* (2013.01)

(58) Field of Classification Search
CPC ...... H03B 5/04; H03B 5/1209; H03B 5/1228; H03B 5/1243; H03L 1/00; H03L 7/099; H03L 7/093; H03L 7/0802; H01L 2924/0002; H01L 2924/00; H01L 25/00; G05F 3/16; G05F 1/46; G05F 1/461; G05F 1/465; H03F 2203/45116; H03F 3/45475

USPC ...... 327/540, 530, 535, 538; 307/28, 29, 85, 307/86, 87; 331/158, 57, 175, 185, 34, 331/176

See application file for complete search history.

(56) References Cited

U.S. PATENT DOCUMENTS

| | | | |
|---|---|---|---|
| 6,249,177 B1 * | 6/2001 | Savage | H03L 7/06 307/29 |
| 6,914,476 B2 | 7/2005 | Ingino, Jr. | |
| 6,940,337 B2 | 9/2005 | Viswanathan et al. | |
| 7,826,584 B2 | 11/2010 | Paek et al. | |
| 2008/0136472 A1 | 6/2008 | Shor | |
| 2009/0189653 A1 * | 7/2009 | Friend | H03L 7/08 327/156 |

(Continued)

OTHER PUBLICATIONS

HTTPS e2e.ti.com/archives/b/thesignal/archive/2012/9/17/protecting-inputs-from-damage-eos Figure 2 and description in office action (Year: 2012).*

(Continued)

*Primary Examiner* — Arnold M Kinkead
(74) *Attorney, Agent, or Firm* — Nathan M. Rau

(57) ABSTRACT

Using a burn-in operational amplifier (opamp) for a phased locked loop (PLL) regulator including activating a voltage stress mode for an integrated circuit comprising a PLL regulator for a PLL, wherein the PLL regulator comprises thin-oxide transistors, and wherein activating the voltage stress mode for the integrated circuit comprises applying an elevated voltage to an input of the PLL regulator; and enabling, during the voltage stress mode, a burn-in opamp coupled to the input of the PLL regulator, wherein enabling the burn-in opamp bias the input of the PLL regulator to a voltage lower than the elevated voltage.

20 Claims, 4 Drawing Sheets

(56) References Cited

U.S. PATENT DOCUMENTS

2010/0271140 A1   10/2010   Raghunathan et al.

OTHER PUBLICATIONS

Jia et al., *A Linear Voltage Regulator for PLL in SOC Application*, 2006 International Conference on Wireless Communications, Networking and Mobile Computing, IEEE, << https://ieeexplore.ieee.org/document/4149341/>> (online), Conference dated Sep. 22-24, 2006, Date Added to IEEE Xplore: Apr. 10, 2007, Wuhan, 2006, DOI: 10.1109/WiCOM.2006.164, Abstract Only, 1 page.

* cited by examiner

USING A BURN-IN OPERATIONAL AMPLIFIER FOR A PHASED LOCKED LOOP REGULATOR

BACKGROUND

Field of the Invention

The field of the invention is data processing, or, more specifically, methods, apparatus, and products for using a burn-in operational amplifier for a phased locked loop regulator.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for using a burn-in operational amplifier (opamp) for a phased locked loop (PLL) regulator are disclosed in this specification. using a burn-in opamp for a PLL regulator includes activating a voltage stress mode for an integrated circuit comprising a PLL regulator for a PLL, wherein the PLL regulator comprises thin-oxide transistors, and wherein activating the voltage stress mode for the integrated circuit comprises applying an elevated voltage to an input of the PLL regulator; and enabling, during the voltage stress mode, a burn-in opamp coupled to the input of the PLL regulator, wherein enabling the burn-in opamp bias the input of the PLL regulator to a voltage lower than the elevated voltage.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
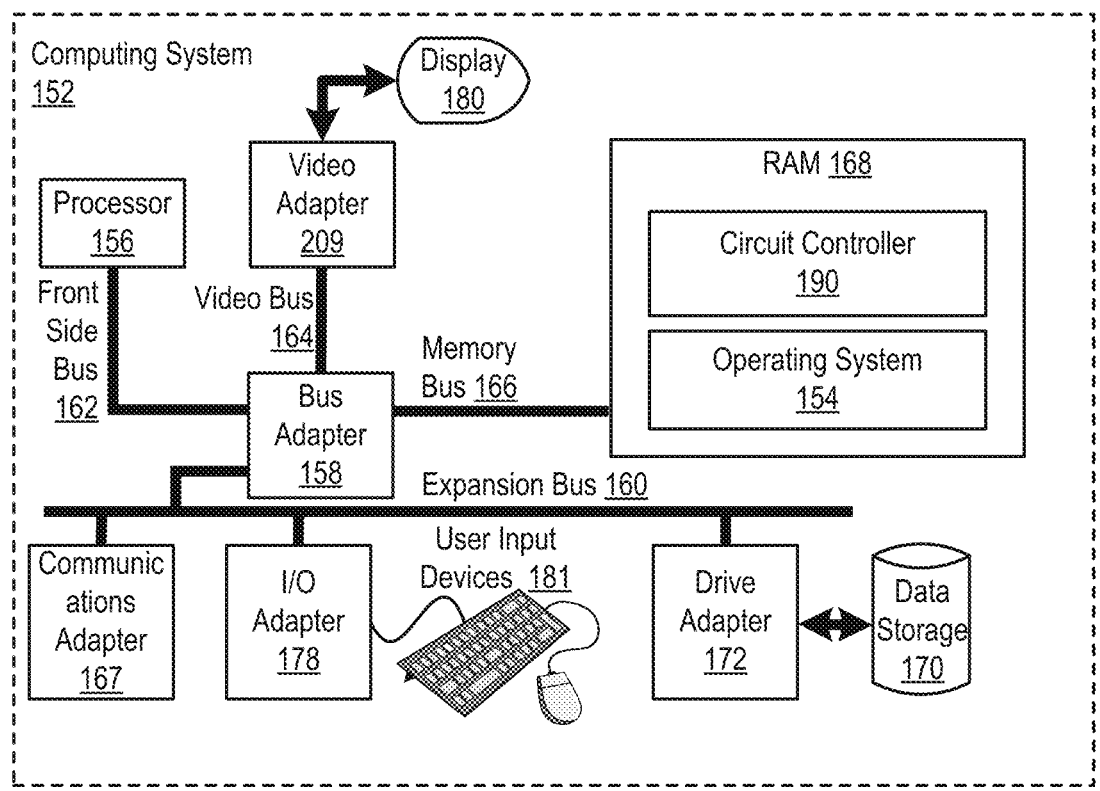
FIG. 1 sets forth a block diagram of an example system configured for using a burn-in operational amplifier (opamp) for a phased locked loop (PLL) regulator according to embodiments of the present invention.

Exemplary methods, apparatus, and products for using a burn-in opamp for a PLL regulator in accordance with the present invention are described with reference to the accompanying drawings, beginning with FIG. 1. FIG. 1 sets forth a block diagram of automated computing machinery comprising an exemplary computing system (152) configured for using a burn-in opamp for a PLL regulator according to embodiments of the present invention. The computing system (152) of FIG. 1 includes at least one computer processor (156) or 'CPU' as well as random access memory (168) (RAM') which is connected through a high speed memory bus (166) and bus adapter (158) to processor (156) and to other components of the computing system (152).

Stored in RAM (168) is an operating system (154). Operating systems useful in computers configured for using a burn-in opamp for a PLL regulator according to embodiments of the present invention include UNIX, Linux™, Microsoft Windows™ AIX™ IBM's i OS™, and others as will occur to those of skill in the art. The operating system (154) in the example of FIG. 1 is shown in RAM (168), but many components of such software typically are stored in non-volatile memory also, such as, for example, on data storage (170), such as a disk drive. Also stored in RAM is a circuit controller (190), a module for using a burn-in operational amplifier (opamp) for a phased locked loop (PLL) regulator according to embodiments of the present invention.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for using a burn-in opamp for a PLL regulator according to embodiments of the present invention include Integrated Drive Electronics ('IDE') adapters, Small Computer System Interface (SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for using a burn-in opamp for a PLL regulator according to embodiments of the present invention include modems for wired dial-up communications, Ethernet (IEEE 802.3) adapters for wired data communications, 802.11 adapters for wireless data communications, and single root input/output virtualization (SR-IOV) adapters.

Figure 2:
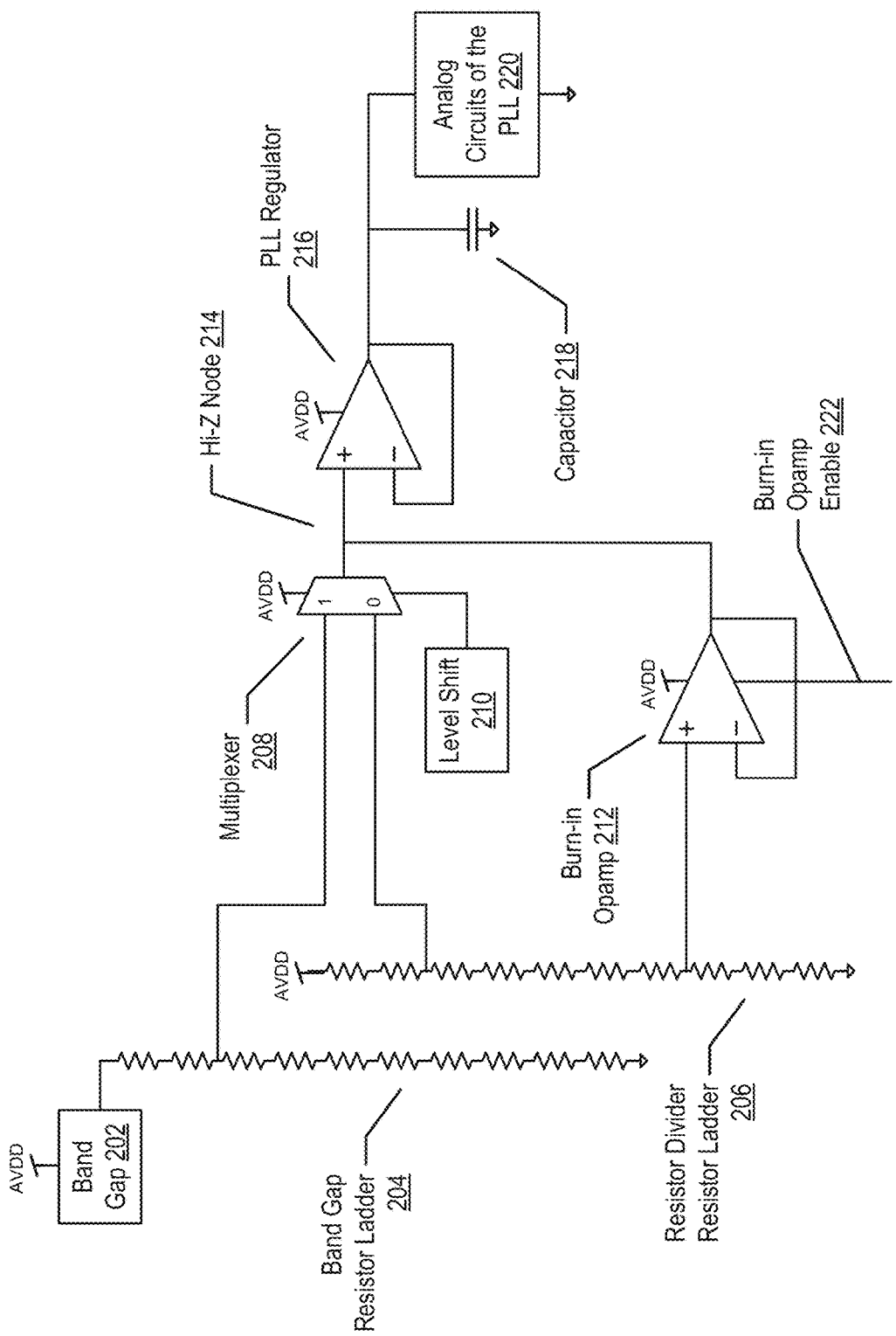
FIG. 2 sets forth a circuit diagram of an example circuit configured for using a burn-in opamp for a PLL regulator according to embodiments of the present invention.

FIG. 2 shows an exemplary circuit for using a burn-in operational amplifier (opamp) for a phased locked loop (PLL) regulator according to embodiments of the present invention. As shown in FIG. 2, the exemplary circuit includes a band gap (202) circuit, a band gap resistor ladder (204), a resistor divider (RDIV) resistor ladder (206), a multiplexer (208), a level shift (210), a burn-in operational amplifier (opamp) (212) with a burn-in opamp enable (222) line, a high-z node (214), a PLL regulator (216), a capacitor (218), and analog circuits of the PLL (220). The circuit shown in FIG. 2 may be part of an integrated circuit, such as the processor (156) of FIG. 1. Further, the circuit shown in FIG. 2 may be part of a PLL or a collection of circuits that support a PLL. The circuit in FIG. 2 is supplied with voltage AVDD.

Some high-performance processors are subjected to a voltage stress mode (i.e., burn-in period) during which an extended period of usage is simulated. The purpose of the voltage stress mode is to trigger the failure of any weaker components that would have failed during an initial usage period. During the voltage stress mode, the temperature is raised and the voltage is elevated (i.e., increased over normal operating voltage) to simulate usage over a greater period of time. For example, a normal operating voltage may be 1 volt, and the elevated voltage may be 1.5 volts. This elevated voltage during the voltage stress mode may be referred to as the burn-in voltage. Such high-performance processors include support for this voltage stress mode.

Within the PLL and other high performance analog circuits, the PLL regulator (216) is used to provide a lower voltage than the input burn-in voltage (e.g., input a 1.5. volt signal and output a 1 volt signal) and reduce noise and voltage extremes for the analog circuits of the PLL (220) connected to the output of the PLL regulator (216). PLL regulators (216) may utilize thick-oxide transistors to endure the stresses of the increased voltage during the voltage stress mode. Thin-oxide transistors may operate faster and be more economical, but could be damaged during the voltage stress mode due to the elevated voltage.

One way to utilize thin-oxide transistors in the PLL regulator (216) without damage voltage stress mode is to reduce the input voltage to the PLL regulator (216) during the voltage stress mode. The burn-in opamp (212) is an operational amplifier that, when enabled, outputs a high impedance, low voltage signal to the high-Z node (214) at the input of the PLL regulator (216). The burn-in opamp (212) biases the input voltage of the PLL regulator (216) at the high-Z node (214) to a voltage lower than an elevated voltage, such as the burn-in voltage.

The burn-in opamp (212) overrides the output signal from the multiplexer (208) at the high-Z node (214) to the main PLL regulator such that, when the burn-in opamp (212) is enabled, the PLL regulator (216) receives a voltage lower than the burn-in voltage (e.g., 0.4 volts). Therefore, during burn-in, the analog circuits of the PLL (220) also receive the lower voltage and avoid damage due to variations and voltage shifts during the voltage stress mode.

The burn-in opamp (212) may be a lower performance opamp than the PLL regulator (216). Specifically, the burn-in opamp (212) need only be able to drive a relatively low amperage signal (e.g., 75 microamps) to be functional. In contrast, the PLL regulator (216) may be required to drive a relatively high amperage signal (e.g., 50 milliamps).

The burn in opamp enable (222) line carries a signal that enables or disables the burn-in opamp (212). The burn in opamp enable (222) line may be coupled to a pin accessible from the exterior of the integrated circuit. Further, the burn in opamp enable (222) line may be activated along with other circuits on the integrated circuit for use during the voltage stress mode.

As discussed above, the PLL regulator (216) is an operation amplifier that reduces noise and voltage extremes on the input of the analog circuits of the PLL (220). The output of the PLL regulator (216) may be coupled to an input of the analog circuits of the PLL (220). Without the PLL regulator (216), the analog circuits of the PLL (220) may be damaged due to the voltage shifts during which the voltage may spike higher than the tolerance of the transistors within the analog circuits of the PLL (220).

Activating the voltage stress mode for the integrated circuit may include applying an elevated voltage, such as the burn-in voltage, to an input of the PLL regulator (216). Applying the elevated voltage to the input of the PLL regulator may include applying the elevated voltage from a resistor ladder, such as the band gap (202) circuit or the RDIV resistor ladder (206) (selected by the multiplexer (208)).

The high-z node (214) is a junction within the integrated circuit at which the output of the burn-in opamp (212) meets the output of the multiplexer (208). Because the band gap resistor ladder (204) and the RDIV resistor ladder (206) both provide a relatively high impedance (e.g., 25-100 kiloohms), the burn-in opamp (212) need only provide a low amperage signal (e.g., 75 microamps) to lower the signal at the high-z node (214) to a voltage below the burn-in voltage (e.g., 0.4 volts). The input of the PLL regulator (216) may be biased to a voltage less than half of the elevated voltage. For example, the output voltage of the multiplexer (208) may be around 1 volt. With the burn-in opamp (212) enabled, the signal at the high-Z node (214) may be biased to a voltage of 0.4 volts.

During the voltage stress mode and while the burn-in opamp (212) is enabled, the PLL regulator (216) may not be operating properly due to the reduced voltage supplied as input. However, during the voltage stress mode, proper operation is not necessary because the integrated circuit is undergoing the voltage stress mode and is not in a normal operation mode in a production setting.

As shown in FIG. 2, the burn-in opamp may be placed in parallel with the band gap (202) circuit and the RDIV resistor ladder (206). The band gap (202) circuit provides a fixed, temperature-independent voltage to the band gap resistor ladder (204). The band gap (202) circuit may produce a voltage slightly higher than is required for normal operation, such as 1.2 volts. The band gap resistor ladder (204) divides the voltage down from the slightly higher voltage to a voltage usable by the circuits connected the outputs of the band gap resistor ladder (204). In some configurations, an opamp may be placed between the band gap (202) circuit and the band gap resistor ladder (204).

Each resistor in the RDIV resistor ladder (206) may be small (e.g., 5-10 kiloohms) so the RDIV resistor ladder (206) may generate a signal that is relatively high impedance (e.g., 25-50 kiloohms). The RDIV resistor ladder (206) provides a method of testing the analog circuits of the PLL (220) by switching between the output of the band gap resistor ladder (204) and the RDIV resistor ladder (206). For example, the RDIV resistor ladder (206) may be used as input into the PLL regulator (216) and the analog circuits of the PLL (220) to test the PLL regulator (216) and the analog circuits of the PLL (220) without the power supply noise reduced by the band gap (202) circuit.

The multiplexer (208) selects between the output of the band gap resistor ladder (204) and the RDIV resistor ladder (206) using the level shift (210). The multiplexer (208) outputs a voltage sufficient to toggle between the band gap resistor ladder (204) and the RDIV resistor ladder (206). The output voltage of the multiplexer is necessarily higher than the output of the burn-in opamp (212) so that the output of the burn-in opamp (212) is able to override the output signal of the multiplexer (208). The burn-in opamp (212) is not coupled to the PLL regulator (216) via a second multiplexer (208) because the level shift may not be able to switch a second multiplexer between the output of the first multiplexer (208), which may be a relatively high voltage (e.g., 1 volt or 1.5 volts), and the output of the burn-in opamp (212) which may be a relatively lower voltage (e.g., 0.4 volts)

The RDIV resistor ladder (206) also provides the input to the burn-in opamp (212). The burn-in opamp (212) may receive, as input, a high-impedance signal. Specifically, the output from the RDIV resistor ladder (206) to the burn-in opamp (212) may be a high impedance (e.g., 25-50 kiloohms) signal that provides the input to the burn-in opamp (212). The burn-in opamp (212) may then drive the relatively high impedance provided by the RDIV resistor ladder (206) to a voltage necessary to bias the input of the PLL regulator (216) down below the burn-in voltage.

The analog circuits of the PLL (220) are the analog components that receive the signal from the output of the PLL regulator (216) and perform the functions of the PLL. Such functions may include producing an output signal with a consistent frequency and reduced jitter.

Figure 3:
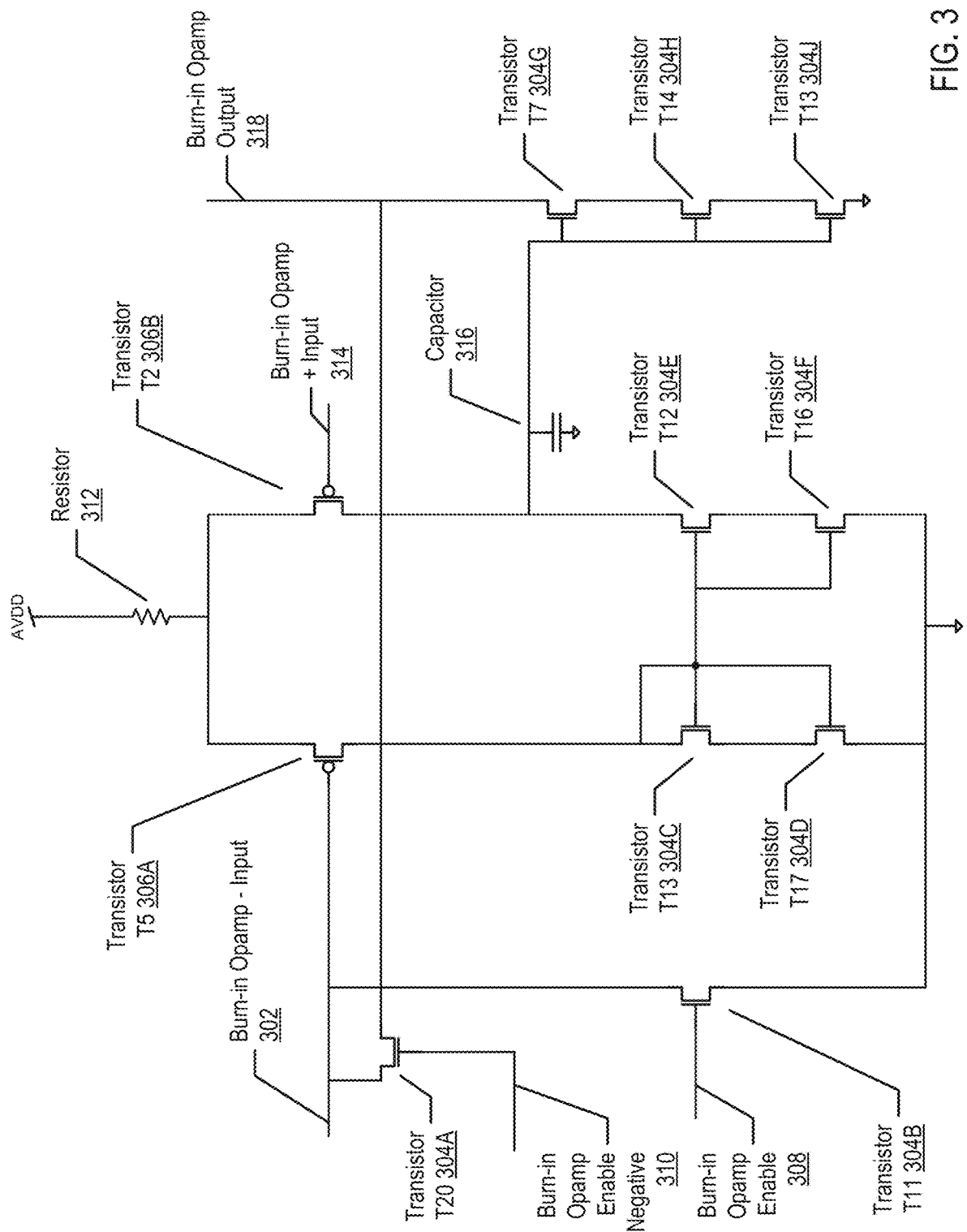
FIG. 3 sets forth a circuit diagram of an example circuit configured for using a burn-in opamp for a PLL regulator according to embodiments of the present invention.

FIG. 3 shows an exemplary circuit for using a burn-in opamp for a PLL regulator according to embodiments of the present invention. Specifically, FIG. 3 shows an exemplary schematic of a burn-in opamp (element 212 in FIG. 2). As shown in FIG. 3, the burn-in opamp includes a burn-in opamp−input (302) line, multiple n-channel field-effect transistors (nfets) (transistor T20 (304A), transistor T11 (304B), transistor T13 (304C), transistor T17 (304D), transistor T12 (304E), transistor T16 (304F), transistor T7 (304G), transistor T14 (304H), transistor T13 (304J)), two p-channel field-effect transistors (pfets) (transistor T5 (306A), transistor T2 (306B)), a burn-in opamp enable (308) line, a burn-in opamp enable negative (310) line, a resistor (312), a burn-in opamp+input (314) line, a capacitor (316), and a burn-in opamp output (318) line.

The burn-in opamp+input (314) line is the positive input of the opamp. The burn-in opamp−input (302) line is the negative input of the opamp. The burn-in opamp+input (314) line may be coupled to a high impedance output signal of, for example, a RDIV resistor ladder. The burn-in opamp−input (302) line may be coupled to the output of the burn-in opamp. The burn-in opamp output (318) line outputs the high impedance output voltage to the high-Z node and PLL regulator.

The burn-in opamp enable (308) line and the burn-in opamp enable negative (310) line are used to enable or disable the burn-in opamp. To enable the burn-in opamp, the burn-in opamp enable (308) line is set to high, and the burn-in opamp enable negative (310) line is set to low. Conversely, to disable the burn-in opamp, the burn-in opamp enable (308) line is set to low, and the burn-in opamp enable negative (310) line is set to high. Transistor T20 (304A) and transistor T11 (304B) are activated or deactivated based on the burn-in opamp enable negative (310) line and the burn-in opamp enable (308) line, respectively, to enable or disable the burn-in opamp.

The resistor (312) provides a resistance between AVDD and the rest of the circuit. The resistor (312) may be a value between five and 15 kiloohms (e.g., 11 kiloohms). Transistors T5 (306A), T2 (306B), T13 (304C), T17 (304D), T12 (304E), and T16 (304F) form the first stage of the operational amplifier. Transistors T7 (304G), T14 (304H), and T13 (304J) form the second stage of the operational amplifier. The capacitor (316) provides a compensation between transistors T2 (306B) and T12 (304E), and transistors T7 (304G), T14 (304H), and T13 (304J). The capacitor couples the output of the first stage of the operational amplifier to the second stage of the operation amplifier.

Figure 4:
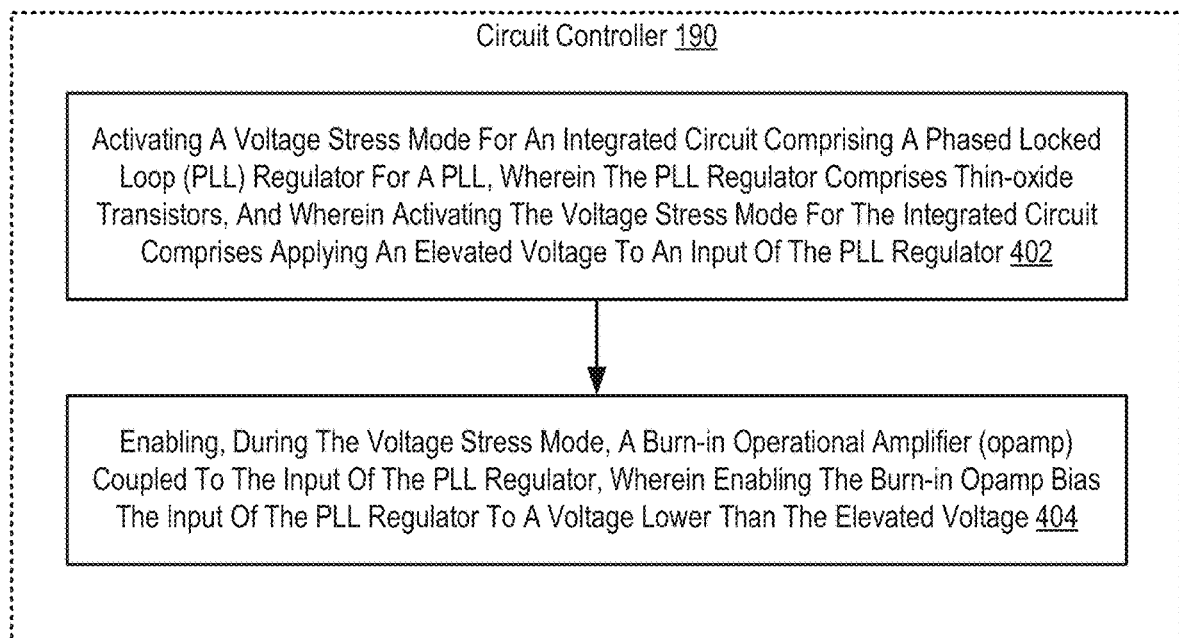
FIG. 4 sets forth a flow chart illustrating an exemplary method for using a burn-in opamp for a PLL regulator according to embodiments of the present invention.

For further explanation, FIG. 4 sets forth a flow chart illustrating an exemplary method for using a burn-in opamp for a PLL regulator according to embodiments of the present invention that includes activating (402) a voltage stress mode for an integrated circuit comprising a phased locked loop (PLL) regulator for a PLL, wherein the PLL regulator comprises thin-oxide transistors, and wherein activating the voltage stress mode for the integrated circuit comprises applying an elevated voltage to an input of the PLL regulator. Activating (402) a voltage stress mode for an integrated circuit comprising a phased locked loop (PLL) regulator for a PLL, wherein the PLL regulator comprises thin-oxide transistors, and wherein activating the voltage stress mode for the integrated circuit comprises applying an elevated voltage to an input of the PLL regulator may be carried out by the circuit controller (190) supplying a burn-in voltage to the integrated circuit. The circuit controller (190) may be an aggregation of hardware and software that controls the signals and voltage applied to various inputs of the integrated circuit.

The method of FIG. 4 further includes enabling (404), during the voltage stress mode, a burn-in operational amplifier (opamp) coupled to the input of the PLL regulator, wherein enabling the burn-in opamp bias the input of the PLL regulator to a voltage lower than the elevated voltage. Enabling (404), during the voltage stress mode, a burn-in operational amplifier (opamp) coupled to the input of the PLL regulator, wherein enabling the burn-in opamp bias the input of the PLL regulator to a voltage lower than the elevated voltage may be carried out by circuit controller (190) enabling the burn-in functions of the integrated circuit, such as the burn-in opamp. The burn-in opamp may be enabled automatically when the high stress mode is activated.

In view of the explanations set forth above, readers will recognize that the benefits of using a burn-in opamp for a PLL regulator according to embodiments of the present invention include:
 Improving the operation of a computing system by adding a burn-in opamp to a PLL regulator to reduce damage to components in the PLL during voltage stress mode, increasing computing system functionality.

Improving the operation of a computing system by allowing high performance and economical components (such as thin oxide transistors) to be used in the PLL without damage during the voltage stress mode, increasing computing system efficiency.

Exemplary embodiments of the present invention are described largely in the context of a fully functional computer system for using a burn-in opamp for a PLL regulator. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of using a burn-in operational amplifier (opamp) for a phased locked loop (PLL) regulator, the method comprising:
    activating a voltage stress mode for an integrated circuit comprising a PLL regulator for a PLL, wherein the PLL regulator comprises thin-oxide transistors, wherein the voltage stress mode is a mode of operation other than a normal mode of operation for the integrated circuit, and wherein activating the voltage stress mode for the integrated circuit comprises applying an elevated voltage to an input of the PLL regulator; and
    enabling, during the voltage stress mode, a burn-in opamp coupled to the input of the PLL regulator, wherein enabling the burn-in opamp bias the input of the PLL regulator to a voltage lower than the elevated voltage.

2. The method of claim 1, wherein the burn-in opamp is a lower performance opamp than the PLL regulator.

3. The method of claim 1, wherein the burn-in opamp receives, as input, a high-impedance signal.

4. The method of claim 1, wherein an output of the PLL regulator is coupled to an input of analog circuits of the PLL.

5. The method of claim 1, wherein the input of the PLL regulator is biased to a voltage less than half of the elevated voltage.

6. The method of claim 1, wherein applying the elevated voltage to the input of the PLL regulator comprises applying the elevated voltage from a resistor ladder.

7. The method of claim 1, wherein the burn-in opamp is in parallel with a band gap circuit and a resistor divider resistor ladder.

8. An integrated circuit comprising:
    a regulator for a phased locked loop (PLL) comprising thin-oxide transistors, wherein the regulator receives, during a voltage stress mode, an elevated voltage to an input of the PLL regulator, wherein the voltage stress mode is a mode of operation other than a normal mode of operation for the integrated circuit; and
    a burn-in operational amplifier (opamp) coupled to the input of the PLL regulator, wherein during the voltage stress mode, the burn-in opamp is enabled to bias the input of the PLL regulator to a voltage lower than the elevated voltage.

9. The integrated circuit of claim 8, wherein the burn-in opamp is a lower performance opamp than the PLL regulator.

10. The integrated circuit of claim 8, wherein the burn-in opamp receives, as input, a high-impedance signal.

11. The integrated circuit of claim 8, wherein an output of the PLL regulator is coupled to an input of analog circuits of the PLL.

12. The integrated circuit of claim 8, wherein the input of the PLL regulator is biased to a voltage less than half of the elevated voltage.

13. The integrated circuit of claim 8, wherein applying the elevated voltage to the input of the PLL regulator comprises applying the elevated voltage from a resistor ladder.

14. The integrated circuit of claim 8, wherein the burn-in opamp is in parallel with a band gap circuit and a resistor divider resistor ladder.

15. A computer program product for using a burn-in operational amplifier (opamp) for a phased locked loop (PLL) regulator, the computer program product disposed upon a non-transitory computer readable medium, the computer program product comprising computer program instructions that, when executed, cause a computer to carry out the steps of:
    activating a voltage stress mode for an integrated circuit comprising a PLL regulator for a PLL, wherein the PLL regulator comprises thin-oxide transistors, wherein the voltage stress mode is a mode of operation other than a normal mode of operation for the integrated circuit, and wherein activating the voltage stress mode for the integrated circuit comprises applying an elevated voltage to an input of the PLL regulator; and
    enabling, during the voltage stress mode, a burn-in opamp coupled to the input of the PLL regulator, wherein enabling the burn-in opamp bias the input of the PLL regulator to a voltage lower than the elevated voltage.

16. The computer program product of claim 15, wherein the burn-in opamp is a lower performance opamp than the PLL regulator.

17. The computer program product of claim 15, wherein the burn-in opamp receives, as input, a high-impedance signal.

18. The computer program product of claim 15, wherein an output of the PLL regulator is coupled to an input of analog circuits of the PLL.

19. The computer program product of claim 15, wherein the input of the PLL regulator is biased to a voltage less than half of the elevated voltage.

20. The computer program product of claim 15, wherein applying the elevated voltage to the input of the PLL regulator comprises applying the elevated voltage from a resistor ladder.

* * * * *